US010094959B2

(12) United States Patent
Schiavoni et al.

(10) Patent No.: US 10,094,959 B2
(45) Date of Patent: Oct. 9, 2018

(54) TRANSPARENT LAYERED ELEMENT HAVING A SPECULAR TRANSMISSION AND A DIFFUSE REFLECTION OF RADIATION INCIDENT THEREON

(71) Applicant: SAINT-GOBAIN GLASS FRANCE, Courbevoie (FR)

(72) Inventors: Michele Schiavoni, Paris (FR); Marie-Virginie Ehrensperger, Aix les Bains (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 193 days.

(21) Appl. No.: 15/033,226

(22) PCT Filed: Oct. 29, 2014

(86) PCT No.: PCT/FR2014/052752
§ 371 (c)(1),
(2) Date: Apr. 29, 2016

(87) PCT Pub. No.: WO2015/063418
PCT Pub. Date: May 7, 2015

(65) Prior Publication Data
US 2016/0282522 A1    Sep. 29, 2016

(30) Foreign Application Priority Data

Oct. 30, 2013  (FR) ..................... 13 60641

(51) Int. Cl.
*G02B 5/02*  (2006.01)
*B32B 17/10*  (2006.01)
(Continued)

(52) U.S. Cl.
CPC ...... *G02B 5/0294* (2013.01); *B32B 17/10036* (2013.01); *B32B 17/10174* (2013.01);
(Continued)

(58) Field of Classification Search
CPC ........ G02B 5/003; G02B 5/02; G02B 5/0205; G02B 5/021; G02B 5/0215; G02B 5/0221;
(Continued)

(56) References Cited

U.S. PATENT DOCUMENTS 3,537,944 A    11/1970 Grubb et al.
5,198,922 A *  3/1993 Chahroudi ............ A47F 11/06
                                                  359/290
(Continued)

FOREIGN PATENT DOCUMENTS

FR      1 559 328 A    3/1969
WO   2012/104547 A1    8/2012

OTHER PUBLICATIONS

International Search Report dated Mar. 16, 2015 in PCT/FR2014/052752 Filed Oct. 29, 2014.
(Continued)

*Primary Examiner* — Arnel C Lavarias
(74) *Attorney, Agent, or Firm* — Oblon, McClelland, Maier & Neustadt, L.L.P.

(57) ABSTRACT

A transparent layered element includes two outer layers that each have a smooth outer main surface and are constituted of dielectric materials having substantially the same refractive index. The layered element also includes a central layer inserted between the outer layers. The central layer is formed either by one or more layers made of metallic material or made of dielectric material having a refractive index different from that of the outer layers. All of the contact surfaces between two adjacent layers of the layered element are textured and parallel to one another. A ratio of a total reflection of the layered element on a side of a first outer layer in a given wavelength range to a total reflection
(Continued)

of the layered element on a side of a second outer layer in the given wavelength range is greater than or equal to 1.5.

20 Claims, 6 Drawing Sheets

(51) Int. Cl.
    G03B 21/62 (2014.01)
    C23C 14/06 (2006.01)
    C23C 14/18 (2006.01)
    C23C 14/35 (2006.01)
    G02B 1/11 (2015.01)
    G02B 5/22 (2006.01)

(52) U.S. Cl.
    CPC .. B32B 17/10761 (2013.01); B32B 17/10788 (2013.01); C23C 14/0641 (2013.01); C23C 14/0652 (2013.01); C23C 14/185 (2013.01); C23C 14/35 (2013.01); G02B 1/11 (2013.01); G02B 5/0278 (2013.01); G02B 5/22 (2013.01); G03B 21/62 (2013.01)

(58) Field of Classification Search
    CPC .. G02B 5/0231; G02B 5/0273; G02B 5/0278; G02B 5/0284; G02B 5/0289; G02B 5/22; G02B 5/223; G02B 5/226; B32B 17/10036; B32B 17/10064; B32B 17/10073; B32B 17/10082; B32B 17/1011; B32B 17/10165; B32B 17/10174; B32B 17/10201; B32B 17/1022; B32B 17/10229
    USPC ................................ 359/599, 601, 609, 614
    See application file for complete search history.

(56) References Cited

U.S. PATENT DOCUMENTS

| | | | |
|---|---|---|---|
| 9,606,272 B2* | 3/2017 | Sandre-Chardonnal | B32B 17/10 |
| 9,846,265 B2* | 12/2017 | Ehrensperger | G02B 5/0289 |
| 2003/0161997 A1* | 8/2003 | Moran | B32B 3/30 428/172 |
| 2009/0316262 A1* | 12/2009 | Kittaka | G02B 5/3041 359/485.01 |
| 2010/0177380 A1* | 7/2010 | Nagahama | B32B 3/30 359/359 |
| 2014/0104690 A1 | 4/2014 | Sandre-Chardonnal | |
| 2016/0003992 A1* | 1/2016 | Nagahama | B32B 3/30 359/839 |

OTHER PUBLICATIONS

U.S. Appl. No. 14/002,563, filed Dec. 6, 2013, 2014/0104690 A1, Sandre-Chardonnal.

* cited by examiner

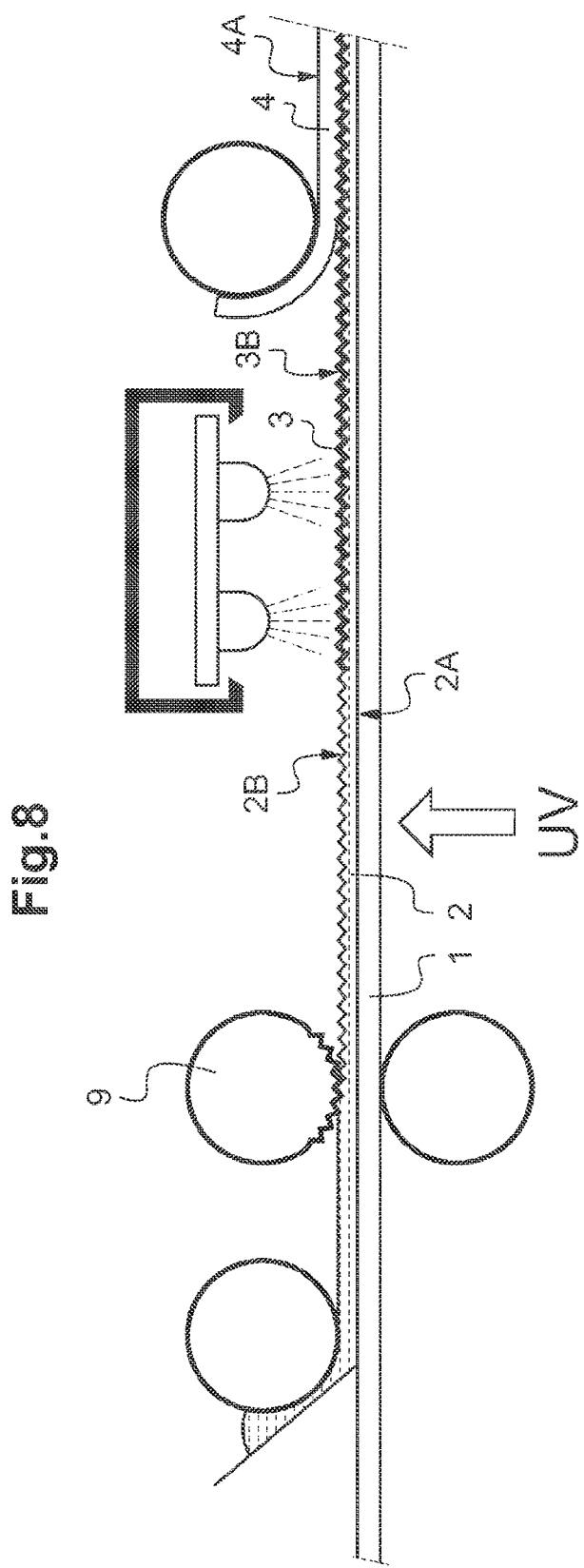

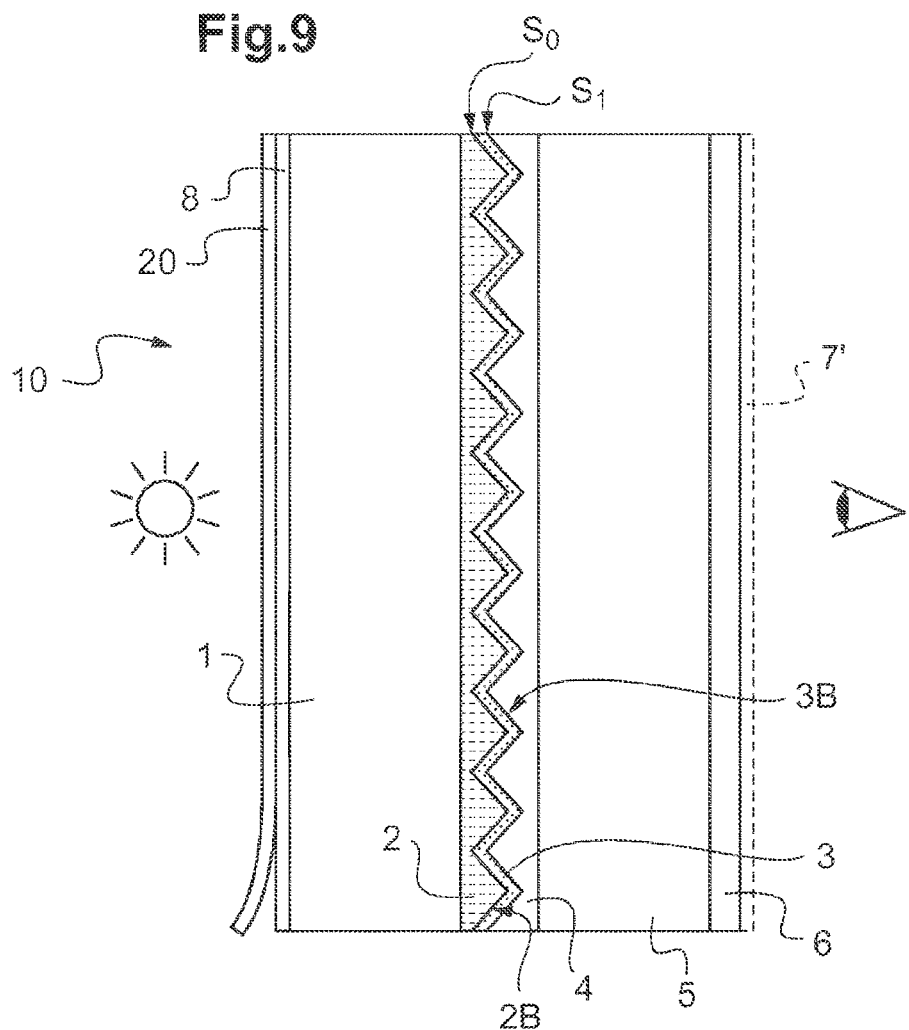

TRANSPARENT LAYERED ELEMENT HAVING A SPECULAR TRANSMISSION AND A DIFFUSE REFLECTION OF RADIATION INCIDENT THEREON

The present invention relates to a transparent layered element having diffuse reflection properties.

The layered element may be rigid or flexible. It may in particular be a glazing, constituted for example based on glass or on organic polymer material, capable of being used for all known applications of glazings, such as for vehicles, buildings, street furniture, interior furnishings, lighting devices, display supports, projection screens, etc. It may also be a flexible film based on organic polymer material, in particular capable of being added onto a surface, for example a surface of a glazing, in order to give it diffuse reflection properties while retaining specular transmission of radiation through the glazing.

Within the context of the invention, a transparent layered element having diffuse reflection properties is an element that gives rise to a specular transmission and a diffuse reflection of radiation incident on the element. Usually, the reflection by an element is said to be diffuse when radiation incident on the element with a given angle of incidence is reflected by the element in a plurality of directions. On the other hand, the reflection by an element is said to be specular when radiation incident on the element with a given angle of incidence is reflected by the element with an angle of reflection equal to the angle of incidence. Similarly, the transmission through an element is said to be diffuse when radiation incident on the element with a given angle of incidence is transmitted by the element in a plurality of directions, whereas the transmission through an element is said to be specular when radiation incident on the element with a given angle of incidence is transmitted by the element with an angle of transmission equal to the angle of incidence.

A transparent layered element having diffuse reflection properties is described in patent application WO 2012/104547 A1. When such a layered element is incorporated into a glazing, the latter has the advantage of not reflecting sharp reflections, owing to the diffuse reflection, which reduces the risks of glare, for example when vehicle headlights are reflected on the glazing. Furthermore, when the layered element is incorporated into a glazing that separates a relatively lighter space, for example an outside space, and a relatively darker space, for example an inside space, the glazing is perceived as diffuse by an observer placed on the lightest side and as transparent by an observer placed on the darkest side. By playing with the level of diffusion of the layered element, it is thus possible to obtain a glazing having an appearance both opaque on the lightest side and transparent on the darkest side. Such glazing may find an application, in particular, as "privacy" glazing for vehicles or buildings, providing privacy inside the vehicle or building.

It has however been observed that, when the light contrast is not pronounced enough between the two sides of the glazing incorporating the layered element, an observer placed on the darkest side perceives an impression of haze or of "dirty glazing", which limits the clarity of the vision through the glazing.

It is this drawback that the invention more particularly intends to find a solution for by proposing a transparent layered element having diffuse reflection properties that makes it possible to ensure clear vision through the element for an observer located on a given side of the element, without an impression of haze or of "dirty glazing", even when the light contrast between the two sides of the element is relatively low.

For this purpose, one subject of the invention is a transparent layered element having two smooth outer main surfaces and comprising:
- two outer layers, which each have a smooth outer main surface and which are constituted of dielectric materials having substantially the same refractive index, and
- a central layer inserted between the outer layers, this central layer being formed either by a single layer made of metallic material or made dielectric material having a refractive index different from that of the outer layers, or by a stack of layers which comprises at least one layer made of metallic material or made of dielectric material having a refractive index different from that of the outer layers, where all the contact surfaces between two adjacent layers of the layered element which are one made of metallic material and the other made of dielectric material, or which are two layers made of dielectric materials having different refractive indices, are textured and parallel to one another, characterized in that the ratio of the total reflection of the layered element on the side of a first outer layer in a given wavelength range to the total reflection of the layered element on the side of the second outer layer in said given wavelength range is greater than or equal to 1.5, preferably greater than or equal to 2, more preferably greater than or equal to 3, more preferably greater than or equal to 4.

The total reflection, in a given wavelength range, of a layered element on the side of one of its outer layers, expressed in %, is measured by positioning the source of radiation so that the radiation is at normal incidence on the element on the side of said outer layer. The total reflection of an element comprises the specular reflection of the element and the non-specular reflection, or diffuse reflection, of the element. Preferably, the given wavelength range comprises at least one portion of the wavelength range of the visible spectrum. In particular, it may be all or part of the wavelength range of the visible spectrum, or a range including spectral bands both in the infrared range and in the visible range.

Surprisingly, a structure of the layered element having an asymmetry in reflection as described above makes it possible to eliminate the impression of haze or of "dirty glazing" for an observer placed on the side of the second outer layer. This is surprising since the fact of having an impression of haze when looking through an element is generally linked to a property of haze in transmission of the element, that is to say the ability of the element to deflect radiation that passes through it. Hence, it would have been possible to believe that the impression of haze or of "dirty glazing", when a transparent layered element having diffuse reflection properties is observed, results from a haze in transmission due for example to an imperfect index match between the two outer layers of the element, or else to an imperfect parallelism of the contact surfaces within the element. The invention goes against this prejudice and eliminates the impression of haze or of "dirty glazing" by adjusting the reflection properties on each side of the element, rather than by seeking to further limit the haze in transmission of the element.

Thus, within the context of the invention, a specular transmission of the radiation incident on the layered element on the side of the first outer layer is obtained, while greatly limiting the reflection of radiation incident on the layered element on the side of the second outer layer. In this way, an observer placed on the side of the second outer layer mainly receives the light originating from the side of the first outer layer, which is transmitted through the layered element in a specular manner irrespective of the direction of the or each light source located on the side of the first outer layer. This results in a clear vision through the layered element, without the impression of haze or "dirty glazing", for the observer placed on the side of the second outer layer, and this being even when the light contrast between the two sides of the element is low or non-existent, or even when the luminosity on the side of the second outer layer is greater than that on the side of the first outer layer.

According to one aspect of the invention, the ratio of the total light reflection of the layered element on the side of a first outer layer to the total light reflection of the layered element on the side of the second outer layer is greater than or equal to 1.5, preferably greater than or equal to 2, more preferably greater than or equal to 3, more preferably greater than or equal to 4.

Within the context of the invention, the total light reflection of a layered element on the side of one of its outer layers, expressed in %, is measured according to the ISO 9050:2003 standard (D65 illuminant; 2° observer), by positioning the light source so that the radiation is at normal incidence on the element on the side of said outer layer.

Each of the two outer layers of the layered element may be formed by a stack of layers, as long as the various constituent layers of the outer layer are constituted of dielectric materials all having substantially the same refractive index. Within the context of the invention, the expression "outer layers" is understood to mean the two layers that flank the central layer by being immediately adjacent thereto, it being understood that they are not necessarily the outermost layers the layered element. Indeed, the layered element may comprise, for each outer layer, at least one additional layer positioned against the outer main surface of this outer layer.

Within the context of the invention, a dielectric material is a non-metallic material. A dielectric material may be of organic or mineral nature. The dielectric materials of mineral nature may be selected from the oxides, nitrides or halides of one or more transition metals, non-metals or alkaline-earth metals preferably selected from silicon, titanium, tin, zinc, aluminum, molybdenum, niobium, zirconium, magnesium. The organic dielectric materials may be selected from polymers.

Within the context of the invention, two dielectric materials have substantially the same refractive index, or have their refractive indices substantially equal, when the absolute value of the difference between their refractive indices at 550 nm is less than or equal to 0.150. Preferably, the absolute value of the difference in refractive index at 550 nm between the constituent materials of the two outer layers of the layered element is, in order of increasing preference: less than or equal to 0.050, less than or equal to 0.030, less than or equal to 0.020, less than or equal to 0.015, less than or equal to 0.010, or less than or equal to 0.005.

Furthermore, within the context of the invention, two dielectric materials have different refractive indices when the absolute value of the difference between their refractive indices at 550 nm is strictly greater than 0.150. Preferably, the absolute value of the difference in refractive index at 550 nm between, on the one hand, the constituent materials of the outer layers and, on the other hand, the constituent material of at least one dielectric layer of the central layer, is greater than or equal to 0.30, preferably greater than or equal to 0.50, more preferably greater than or equal to 0.80.

According to the invention, this relatively large difference in refractive index occurs at least one textured contact surface inside the layered element. This makes it possible to promote the reflection of radiation on this textured contact surface, i.e. a diffuse reflection of the radiation by the layered element.

Within the context of the invention, the following definitions are used.

The contact surface between two adjacent layers is the interface between the two adjacent layers.

A transparent element is an element through which there is a transmission of radiation at least in the wavelength ranges of use for the targeted application of the element. By way of example, when the element is used as a vehicle or building glazing, it is transparent at least in the visible wavelength range.

A glazing is an organic or mineral, rigid transparent substrate.

A textured surface is a surface for which the surface properties vary on a greater scale than the wavelength of the radiation incident on the surface, so that the incident radiation is transmitted and reflected in a diffuse manner by the surface. Preferably, a textured, or rough, surface has a roughness parameter corresponding to the arithmetic mean deviation Ra of greater than or equal to 0.5 µm, in particular of between 1 µm and 2 mm. Conventionally, the arithmetic mean deviation Ra is the arithmetic mean of all the absolute distances of the roughness profile R measured from a median line of the profile over an evaluation length.

A smooth surface is a surface for which the surface irregularities are such that the radiation incident on the surface is not deflected by these surface irregularities. The incident radiation is then transmitted and reflected in a specular manner by the surface. In particular, a smooth surface is a surface for which the surface irregularities have dimensions less than the wavelength of the radiation incident on the surface, or are large-scale undulations with very small slopes, in particular of less than 1°.

It is noted that, if an outer layer is formed by a stack of layers constituted of dielectric materials all having substantially the same refractive index, it is the outer main surface of the outermost layer with respect to the central layer that must be smooth, it being understood that the contact surfaces between the various constituent layers of the outer layer may not be smooth.

It is also noted that the layered element according to the invention may comprise at least one additional layer positioned against the outer main surface of at least one of the two outer layers, where the additional layer is constituted of a metallic material or of a dielectric material having a refractive index different from that of the dielectric materials of the outer layers. In this case, the outer main surface of the additional layer must be smooth.

According to the invention, the absorption of the layered element in said given wavelength range for a radiation incident on the side of the second outer layer is strictly greater than the absorption of the layered element in said given wavelength range for a radiation incident on the side of the first outer layer.

Thanks to the invention, a specular transmission of the radiation incident on the layered element on the side of the first outer layer is obtained, while limiting the reflection of radiation incident on the layered element on the side of the second outer layer. The specular transmission through the layered element is due to the fact that the two outer layers have smooth outer main surfaces and are constituted of materials having substantially the same refractive index, to the fact that the outer main surfaces of the layered element are also smooth, and to the fact that all the contact surfaces between two adjacent layers of the layered element which are one made of metallic material and the other made of dielectric material, or which are two layers made of dielectric materials having different refractive indices, are textured and parallel to one another, as explained in application WO 2012/104547 A1.

Furthermore, a diffuse reflection of radiation incident on the layered element on the side of the first outer layer is obtained so that an observer placed on the side of the first outer layer perceives the layered element as diffuse, or even opaque. The diffuse reflection on the layered element is due to the fact that each contact surface between two adjacent layers which are one metallic and the other dielectric, or which are two dielectric layers having different refractive indices, is textured. Thus, when radiation incident on the layered element reaches such a contact surface, it is reflected by the metallic layer or owing to the difference in refractive index between the two dielectric layers and, as the contact surface is textured, the reflection is diffuse.

Preferably, the space located on the side of the first outer layer is lighter than the space located on the side of the second outer layer. By adjusting the total light reflection of the layered element on the side of the first outer layer, it is thus possible to obtain a layered element having an appearance that is both opaque on the side of the first outer layer and transparent on the side of the second outer layer. Such a layered element may be used, in particular, as all or part of a "privacy" glazing, in particular for a vehicle or building.

The parallelism of the textured contact surfaces implies that, for each layer of the central layer which is flanked by layers of nature, dielectric or metallic, different from its own or having refractive indices different from its own, the thickness of the layer is uniform perpendicular to its contact surfaces with the adjacent layers. This uniformity of the thickness may be global over the entire extent of the texture, or local over sections of the texture. In particular, when the texture has slope variations, the thickness between two consecutive textured contact surfaces may change, by section, as a function of the slope of the texture, the textured contact surfaces however still remaining parallel to one another. This is in particular the case for a layer deposited by sputtering, where the thickness of the layer is thinner when the slope of the texture increases. Thus, locally, over each texture section having a given slope, the thickness of the layer remains constant, but the thickness of the layer is different between a first texture section having a first slope and a second texture section having a second slope different from the first slope.

Advantageously, in order to obtain the parallelism of the textured contact surfaces within the layered element, the or each constituent layer of the central layer is a layer deposited by sputtering. Indeed, sputtering, in particular magnetron sputtering, guarantees that the surfaces delimiting the layer are parallel to one another, which is not the case other deposition techniques such as evaporation or chemical vapor deposition (CVD), or else the sol-gel process. Yet the parallelism of the textured contact surfaces within the layered element is essential for obtaining specular transmission through the element.

In one advantageous embodiment, the ratio of the transmission of the layered element in said given wavelength range to the total reflection of the layered element on the side of the second outer layer in said given wavelength range is greater than or equal to 1.5, preferably greater than or equal to 2.

The transmission of a layered element in a given wavelength range, expressed in %, is measured by positioning the source of radiation so that the radiation is at normal incidence on the layered element. It doesn't matter whether the radiation passes through the layered element by going from the first outer layer to the second outer layer or by going from the second outer layer to the first outer layer.

According to one aspect of the invention, the ratio of the light transmission of the layered element to the total light reflection of the layered element on the side of the second outer layer is greater than or equal to 1.5, preferably greater than or equal to 2.

Within the context of the invention, the light transmission of a layered element, expressed in %, is measured according to the ISO 9050:2003 standard (D65 illuminant; 2° observer), by positioning the light source so that the radiation is at normal incidence on the layered element.

In the embodiment above, transmission of radiation through the layered element is favored with respect to the reflection of radiation incident on the layered element on the side of the second outer layer. Thus, even if the light intensity is substantially the same on both sides of the layered element, or even if the light intensity is slightly greater on the side of the second outer layer, an observer placed on the side of the second outer layer receives predominantly light originating from the side of the first outer layer, which is transmitted in a specular manner through the element, and only minorly light originating from the side of the second outer layer, which is reflected on the element. This helps to reduce the impression of haze or of "dirty glazing" and thus to improve the clarity of vision through the layered element.

According to one aspect of the invention, the layered element comprises at least one element that absorbs in the visible wavelength range, either as second outer layer, or as additional layer positioned on the side of the second outer layer. In the case of an additional layer positioned on the side of the second outer layer and constituted of a metallic material or of a dielectric material having a refractive index different from that of the outer layers, the outer main surface the additional layer must be smooth, in order to maintain specular transmission of radiation through the layered element.

Preferably, the absorbent element has a light transmission of between 10% and 60%. Within the context the invention, the light transmission of an element, expressed in %, is measured according to the ISO 9050:2003 standard (D65 illuminant; 2° observer).

In one embodiment, the absorbent element is a rigid or flexible substrate, in particular made of glass or made of organic polymer material, which is bulk-tinted, by appropriate colorants. It may in particular be a substrate made of tinted glass such as those sold by Saint-Gobain Glass in the SGG PARSOL® range or by Saint-Gobain Sekurit in the SGS THERMOCONTROL® Venus range, which have a light transmission of between 10% and 60%, for a thickness of the order of 1 mm to 8 mm, in particular from 1.5 mm to 6 mm. It may otherwise be a tinted polymer substrate, in particular based on polyesters such as polyethylene terephthalate (PET), polybutylene terephthalate (PBT), polyethylene naphthalate (PEN); polyacrylates such as polymethyl methacrylate (PMMA); polycarbonates; polyurethanes; polyamides; polyimides; fluoropolymers such as ethylene tetrafluoroethylene (ETFE), polyvinylidene fluoride (PVDF), polychlorotrifluoroethylene (PCTFE), ethylene chlorotrifluoroethylene (ECTFE), fluorinated ethylene-propylene (FEP) copolymers; photocrosslinkable and/or photopolymerizable resins, such as thiol-ene, polyurethane, urethane-acrylate and polyester-acrylate resins; polythiourethanes.

In another embodiment, the absorbent element is an interlayer sheet made of organic polymer material, in particular that is thermoformable or pressure-sensitive, i.e. the type of sheet that is used as an interlayer in laminated glazings, which is bulk-tinted, by appropriate colorants. It may in particular be at least one sheet based on polyvinylbutyral (PVB), ethylene-vinyl acetate (EVA), polyurethane (PU), polyethylene terephthalate (PET) or polyvinyl chloride (PVC). These tinted polymer interlayer sheets have for example a light transmission of between 25% and 60%, in particular between 30% and 45%, for a thickness of the order of 0.2 mm to 0.8 mm, generally in the vicinity of 0.38 mm. In one advantageous configuration, the tinted interlayer sheet is laminated or calendered to a substrate, for example a clear or extra-clear glass.

In yet another embodiment, the absorbent element is a thin layer that absorbs in the visible wavelength range, positioned on one face of a rigid or flexible substrate, in particular made of glass or made of organic polymer material, or on one face of a polymer interlayer sheet. The expression "thin layer" is understood to mean a layer having a thickness of less than 10 µm, preferably of less than 1 µm. It may also be a stack of thin layers, at least one of which is absorbent in the visible wavelength range. It may for example be layers based on oxide of nickel and/or iron and/or chromium, which may be deposited by a thermal decomposition technique, in particular by a pyrolysis in the gas phase, in powder form or in the liquid phase; by a vacuum technique, in particular by sputtering, especially magnetron sputtering; or else by a sol-gel process.

According to one aspect of the invention, the central layer of the layered element comprises at least one thin layer constituted of a dielectric material having a high refractive index, different from the refractive index of the outer layers, such as $Si_3N_4$, $SnO_2$, ZnO, AlN, NbO, NbN, $TiO_2$, or constituted of a dielectric material having a low refractive index, different from the refractive index of the outer layers, such as $SiO_2$, $Al_2O_3$, $MgF_2$, $AlF_3$. The central layer of the layered element may also comprise at least one metallic thin layer, in particular a thin layer of silver, of gold, of titanium, niobium, of silicon, of aluminum, of nickel-chromium (NiCr) alloy, of stainless steel, or of alloys thereof.

Advantageously, the composition of the central layer of the layered element may be adjusted in order to give additional properties to the layered element, for example thermal properties, of solar-control and/or low emissivity type. Thus, in one embodiment, the central layer of the layered element is a stack of thin layers comprising an alternation of "n" metallic functional layers, in particular functional layers based on silver or on a metal alloy containing silver, and of "(n+1)" antireflection coatings, with n≥1, where each metallic functional layer is positioned between two antireflection coatings.

In a known manner, such a stack having a metallic functional layer has reflection properties in the range of solar radiation and/or in the range of long-wavelength infrared radiation. In such a stack, the metallic functional layer or layers essentially determine the thermal performances, whereas the antireflection coatings that flank them act on the optical appearance in an interferential manner. Indeed, while the metallic functional layers make it possible to obtain desired thermal performances even at low geometric thickness, of the order of 10 nm for each metallic functional layer, they however greatly oppose the passage of radiation in the visible wavelength range. Hence, antireflection coatings on either side of each metallic functional layer are necessary to ensure a good light transmission in the visible range. In practice, it is the total stack of the central layer, comprising the metallic thin layers and the antireflection coatings, which is optically optimized. Advantageously, the optical optimization may be carried out on the total stack of the layered element, that is to say including the outer layers positioned on either side of the central layer and the optional additional layers.

The layered element obtained then combines optical properties, namely properties of specular transmission and of diffuse reflection of radiation incident on the layered element, and thermal properties, namely solar-control and/or low-emissivity properties. Such a layered element may be used for solar-protection and/or thermal insulation glazings, in particular for vehicles or buildings.

According to one aspect of the invention, the central layer of the layered element is an asymmetric stack of thin layers, the ratio of the total reflection of the central layer on the side turned toward the first outer layer in said given wavelength range to the total reflection of the central layer on the side turned toward the second outer layer in said given wavelength range being greater than or equal to 1.5, preferably greater than or equal to 2.

According to one aspect of the invention, the ratio of the total light reflection of the central layer on the side turned toward the first outer layer to the total light reflection of the central layer on the side turned toward the second outer layer is greater than or equal to 1.5, preferably greater than or equal to 2.

Advantageously, the layered element comprises, on its outer main surface located on the side of the first outer layer and/or on its outer main surface located on the side of the second outer layer, an antireflection coating at the interface between the air and the constituent material of the layer forming the outer main surface.

An antireflection coating on the outer main surface of the layered element located on the side of the second outer layer makes it possible to limit the specular reflection of radiation on this outer main surface. This results in a reduction of the total reflection of radiation on the side of the second outer layer, which helps to reduce the impression of haze or of "dirty glazing" and thus to improve the clarity of vision through the layered element for an observer placed on the side of the second outer layer.

Furthermore, when an antireflection coating is present on the outer main surface of the layered element located on the side of the first outer layer, radiation incident on the layered element on the side of the first outer layer is reflected in a favored manner at each textured contact surface rather than on the smooth outer main surface of the layered element, which corresponds to a diffuse reflection mode rather than a specular reflection mode. A diffuse reflection of the radiation by the layered element on the side of the first outer layer is thus favored with respect to a specular reflection.

The antireflection coating provided on at least one of the outer main surfaces of the layered element may be of any type that makes it possible to reduce the reflection of radiation at the interface between the air and the layer forming the outer main surface of the layered element. It may be, in particular, a layer having a refractive index between the refractive index of air and the refractive index of the layer forming the outer main surface, such as a layer deposited on the surface of the layer forming the outer main surface by a vacuum technique or a porous layer of sol-gel type, or else, in the case where the layer forming the outer main surface is made of glass, a superficial portion etched from this glass layer obtained by an acid etching treatment. As a variant, the antireflection coating may be formed by a stack of thin layers having alternately lower and higher refractive indices that acts as an interference filter at the interface between the air and the layer forming the outer main surface, or by a stack of thin layers having a continuous or stepped gradient of refractive indices between the refractive index of air and that of the layer forming the outer main surface.

The smooth outer main surfaces of the layered element may be flat or curved. In particular, the layered element may be a curved glazing, for example for buildings or vehicles, in particular motor vehicles. Preferably, the smooth outer main surfaces of the layered element are parallel to one another. This helps to limit the light dispersion for radiation passing through the layered element, and therefore helps to improve the clarity of vision through the layered element.

According to one aspect of the invention, the texture each contact surface between two adjacent layers of the layered element which are one made of metallic material and the other made of dielectric material, or which are two layers made of dielectric materials having different refractive indices, is formed by a plurality of features that are recessed or protruding relative to a general plane of the contact surface. Preferably, the mean height of the features of each contact surface between two adjacent layers of the layered element which are one made of metallic material and the other made of dielectric material, or which are two layers made of dielectric materials having different refractive indices, is between 1 µm and 2 mm and better still between 2 µm and 200 µm, even better still between 5 µm and 100 µm. Within the meaning of the invention, the mean height of the features of the contact surface is defined as the arithmetic mean of the distances $y_i$ in absolute values taken between the peak and the general plane of the contact surface for each feature of the contact surface, equal to $$\frac{1}{n}\sum_{i=1}^{n}|y_i|,$$

which corresponds to the arithmetic mean deviation Ra.

The features of the texture of each contact surface between two adjacent layers of the layered element which are one made of metallic material and the other made of dielectric material, or which are two layers made of dielectric materials having different refractive indices, may be distributed randomly over the contact surface. As a variant, the features of the texture of each contact surface between two adjacent layers of the layered element which are one made of metallic material and the other made of dielectric material, or which are two layers made of dielectric materials having different refractive indices, may be distributed periodically over the contact surface. These features may be, in particular, cones, pyramids, grooves, ribs, wavelets.

The features may also be present only in certain zones of each contact surface, it being possible for these textured zones to be separated by non-textured zones of each contact surface. In this case, as one characteristic of the layered element according to the invention is that all the contact surfaces between two adjacent layers of the layered element which are of different natures, or have different refractive indices, are textured and parallel to one another, a glazing or a film is obtained that comprises the layered element according to the invention only in certain zones, corresponding to the textured zones of each contact surface. This results in a diffuse reflection of radiation only in certain zones of the glazing or film, corresponding to the textured zones of each contact surface. Spatial variations of the level of diffuse reflection may also be obtained according to the same principle, by spatially adjusting the properties of the texture of each contact surface. It is thus possible, for example, to display a picture or a logo by diffuse reflection of the visible light on one side of the glazing or film, which is located on the side of the first outer layer of the layered element, this picture or logo being invisible on the opposite side of the glazing or film, which is located on the side of the second outer layer of the layered element.

A texturing of only certain zones of each contact surface may be produced in practice by depositing the or each layer of the central layer in a conformal manner on a substrate having partial texturing. Partial texturing of a substrate may be obtained by any known texturing process, for example by embossing the surface of the substrate, by abrasion, by sandblasting, by chemical treatment or by engraving, for example using masks to retain at least one non-textured portion of the surface of the substrate.

According to one aspect of the invention, for each layer of the central layer that is flanked by layers having a nature, metallic or dielectric, different from its own, or having refractive indices different from its own, the thickness of this layer, taken perpendicular to its contact surfaces with the adjacent layers, is small with respect to the mean height of the features of each of its contact surfaces with the adjacent layers. Such a small thickness makes it possible to increase the probability that the inlet interface of radiation into this layer and the outlet interface of radiation out of this layer are parallel, and therefore to increase the percentage of specular transmission of the radiation through the layered element. Advantageously, the thickness of each layer of the central layer which is inserted between two layers having a nature, metallic or dielectric, different from its own, or having refractive indices different from its own, where this thickness is taken perpendicular to its contact surfaces with the adjacent layers, is less than ¼ of the mean height of the features of each of its contact surfaces with the adjacent layers. In practice, when the central layer is a thin layer or a stack of thin layers, the thickness of the or each layer of the central layer is of the order of, or less than, ¹/₁₀ of the mean height of the features of each textured contact surface of the layered element.

In one embodiment of the invention, one of the two outer layers of the layered element is a textured outer layer comprising a rigid or flexible substrate, in particular made of glass or made of organic polymer material, one main surface of which is textured. The texturing of one of the main surfaces of the substrate may be obtained by any known texturing process, example by embossing the surface of the substrate preheated to a temperature at which it is possible to deform it, in particular by rolling using a roll that has, at its surface, texturing complementary to the texturing to be formed on the substrate; by abrasion using abrasive particles or surfaces, in particular by sandblasting; by chemical treatment, in particular acid treatment in the case of a glass substrate; by molding, in particular injection molding in the case of a thermoplastic polymer substrate; by engraving.

Examples of textured glass substrates that can be used directly as a textured outer layer of the layered element include:

the glass substrates sold by Saint-Gobain Glass in the SGG SATINOVO® range, which have, on one of their main surfaces, a texture obtained by sandblasting or acid treatment;

the glass substrates sold by Saint-Gobain Glass in the SGG ALBARINO® S, P or G range or in the SGG MASTERGLASS® range, which have, on one of their main surfaces, a texture obtained by rolling;

the high-index glass substrates textured by sandblasting such as flint glass for example sold by Schott under the references SF6 (n=1.81 at 550 nm), 7SF57 (n=1.85 at 550 nm), N-SF66 (n=1.92 at 550 nm), P-SF68 (n=2.00 at 550 nm).

In the case of a textured outer layer formed by a textured substrate made of organic polymer material, examples of suitable materials include, in particular, polyesters such as polyethylene terephthalate (PET), polybutylene terephthalate (PET), polyethylene naphthalate (PEN); polyacrylates such as polymethyl methacrylate (PMMA); polycarbonates; polyurethanes; polyamides; polyimides; fluoropolymers such as ethylene tetrafluoroethylene (ETFE), polyvinylidene fluoride (PVDF), polychlorotrifluoroethylene (PCTFE), ethylene chlorotrifluoroethylene (ECTFE), fluorinated ethylene-propylene (FEP) copolymers; photocrosslinkable and/or photopolymerizable resins, such as thiol-ene, polyurethane, urethane-acrylate and polyester-acrylate resins; polythiourethanes. These polymers generally have a refractive index range at 550 nm ranging from 1.30 to 1.70. However, it is beneficial to note that some of these polymers, and in particular polymers comprising sulfur such as polythiourethanes, may have high refractive indices at 550 nm that may range up to 1.74.

When it is the second outer layer that comprises a textured substrate, this textured substrate may be bulk-tinted so as to form an absorbent element, or be coated with an absorbent thin layer, as described above.

In another embodiment of the invention, one of the two outer layers of the layered element is a textured outer layer formed by a conformable layer of which one main surface is textured and which is added via its other main surface to a rigid or flexible substrate. It may in particular be a thermoformable layer or a layer made photocrosslinkable and/or photopolymerizable material. In this case, a highly suitable process for texturing one of the main surfaces of the conformable layer is, in particular, embossing. Preferably, the photocrosslinkable and/or photopolymerizable material is in liquid form at ambient temperatures and gives, when it has been irradiated and photocrosslinked and/or photopolymerized, a transparent solid that is free of bubbles or of any other irregularity. It may be in particular a resin such as those customarily used as adhesives, glues or surface coatings. These resins are generally based on monomers/comonomers/prepolymers of epoxy, epoxy silane, acrylate, methacrylate, acrylic acid or methacrylic acid type. Mention may be made, for example, of thiol-ene, polyurethane, urethane-acrylate and polyester-acrylate resins. Instead of a resin, it may be a photocrosslinkable aqueous gel, such as a polyacrylamide gel.

When one of the two outer layers of the layered element is a textured outer layer having one textured main surface and its other main surface which is smooth, the central layer is advantageously formed:

either by a single layer made of metallic material, or made of dielectric material having a refractive index different to that of the textured outer layer, deposited in a conformal manner on the textured main surface of the textured outer layer, or by a stack of layers, which comprises at least one layer made of metallic material or made of dielectric material having a refractive index different from that of the textured outer layer, which are deposited successively in a conformal manner on the textured main surface of the textured outer layer.

According to the invention, it is considered that the deposition of the central layer, or the successive deposition of the layers of the central layer, on the textured main surface of the textured outer layer is carried out in a conformal manner if, following the deposition, the surface of the or each layer of the central layer is textured and parallel to the textured main surface of the textured outer layer. According to one advantageous characteristic, the deposition of the central layer in a conformal manner, or of the layers of the central layer successively in a conformal manner, on the textured main surface of the textured outer layer is carried out by sputtering, in particular magnetron sputtering. Other conformal deposition techniques can also be envisaged, such as evaporation techniques, in particular for the deposition metallic layers.

According to one aspect of the invention, the other outer layer of the layered element, that is to say the outer layer located on the other side of the central layer with respect to the textured outer layer, comprises a layer of curable material having a refractive index essentially equal to that of the textured outer layer, deposited on the textured main surface of the central layer on the opposite side from the textured outer layer while being initially in a viscous, liquid or pasty state suitable for forming operations.

The layer deposited initially in a viscous, liquid or pasty state may be, in particular, a layer of varnish type, which then ensures a planarization of the surface the layered element. As a variant, the layer deposited initially in a viscous, liquid or pasty state may be a layer that ensures firm attachment between, on the one hand, the textured outer layer provided with the central layer and, on the other hand, a counter-substrate.

The layer deposited initially in a viscous, liquid or pasty state may be a layer of photocrosslinkable and/or photopolymerizable material. Preferably, this photocrosslinkable and/or photopolymerizable material is in liquid form at ambient temperature and gives, when it has been irradiated and photocrosslinked and/or photopolymerized, a transparent solid that is free of bubbles or of any other irregularity. It may be in particular a resin such as those customarily used as adhesives, glues or surface coatings. These resins are generally based on monomers/comonomers/prepolymers of epoxy, epoxy silane, acrylate, methacrylate, acrylic acid or methacrylic acid type. Mention may be made, for example, of thiol-ene, polyurethane, urethane-acrylate and polyester-acrylate resins. Instead of a resin, it may be a photocrosslinkable aqueous gel, such as a polyacrylamide gel.

As a variant, the layer deposited initially in a viscous, liquid or pasty state may be a layer deposited by a sol-gel process.

In one embodiment, the other outer layer of the layered element, that is to say the outer layer located on the other side of the central layer with respect to the textured outer layer, comprises a sol-gel layer comprising a silica-based organic/inorganic hybrid matrix. Such a sol-gel layer is particularly advantageous since it offers the possibility of accurately adjusting the value of its refractive index, so that it is as close as possible to that of the textured outer layer. According to the invention, the index match or index difference between the two outer layers of the layered element corresponds to the absolute value of the difference between the refractive indices at 550 nm of their constituent dielectric materials. The smaller the index difference, the clearer the vision through the layered element. In particular, excellent vision is obtained with an index match of less than or equal to 0.050, preferably of less than or equal to 0.030 and better still less than or equal to 0.015.

The sol-gel process consists, firstly, in preparing a "sol-gel solution" containing precursors which give rise, in the presence of water, to polymerization reactions. When this sol-gel solution is deposited on a surface, due to the presence of water in the sol-gel solution or in contact with ambient humidity, the precursors hydrolyze and condense in order to form a network that traps the solvent. These polymerization reactions lead to the formation of increasingly condensed species, which result in colloidal particles forming sols then gels. The drying and densification of these gels, at a temperature of the order of several hundreds of degrees, results, in the presence of a silica-based precursor, in a sol-gel layer corresponding to a glass, the characteristics of which are similar to those of a conventional glass.

Due to their viscosity, the sol-gel solutions, in the form of a colloidal solution or of a gel, may be deposited easily on the textured main surface of the central layer on the opposite side from the textured outer layer, while conforming to the texture of this surface. The sol-gel layer will "fill in" the roughness of the central layer. Indeed, this layer comprises a surface that adopts the surface roughness of the central layer which is thus textured and an outer main surface opposite this surface which is flat. The layers deposited by a sol-gel process therefore provide a planarization of the surface of the layered element.

The silica-based organic/inorganic hybrid matrix of the sol-gel layer is obtained from mixed precursors which are organosilanes $R_nSiX_{(4-n)}$. These molecules simultaneously comprise hydrolyzable functions that give rise to a silica network or matrix comprising organic functions that remain attached to the silica skeleton.

According to one embodiment, the sol-gel layer also comprises particles of at least one metal oxide or of at least one chalcogenide.

According to one embodiment, the silica-based organic/inorganic hybrid matrix also comprises at least one metal oxide. Such a silica-based matrix comprising organic functions and at least one metal oxide may be obtained from the combined use of organosilane and of at least one precursor of a metal oxide. These precursors then form with the organosilane a hybrid matrix of silica and of metal oxide.

In one preferred embodiment, the sol-gel layer comprises an organic/inorganic hybrid matrix based on silica and on at least one metal oxide, dispersed in which are particles of at least one metal oxide or of at least one chalcogenide such as an organic/inorganic hybrid matrix of silica and of zirconium oxide in which titanium dioxide particles are dispersed.

The main compounds of the sol-gel layer are constituted by the compounds forming the matrix and the particles dispersed in said matrix. The main compounds of the sol-gel layer may therefore be: the silica comprising organic functions of the matrix; the metal oxide(s) of the matrix; the metal oxide and/or chalcogenide particles dispersed in the matrix. In order to accurately adapt the refractive index of the sol-gel layer, the proportions of metal oxides originating from the matrix or dispersed in the form of particles are modified. As a general rule, the metal oxides have a higher refractive index than that of silica. By increasing the proportions of metal oxide, the refractive index of the sol-gel layer is increased. The refractive index of the sol-gel layer increases linearly as a function of the volume fraction of one type of metal oxide for volume proportions of said metal oxide below a threshold value. For example, when $TiO_2$ particles are added, a linear variation of the refractive index of the sol-gel layer is observed for volume proportions of $TiO_2$ with respect to the total volume of the main compounds of the sol-gel layer of less than 20%.

It is therefore possible to determine theoretically the refractive index of a sol-gel layer as a function of the main compounds forming it and thus to determine theoretically the formulation of a sol-gel solution which will make it possible to obtain, after curing, a sol-gel layer having the required refractive index. In particular, it is possible to adjust the formulation of the sol-gel solution so as to obtain, after curing, a sol-gel layer having a refractive index match with the textured outer layer to within 0.015, and this being in a broad refractive index range since these sol-gel layers may have a refractive index at 550 nm that varies within an index range extending in particular from 1.459 to 1.700.

The sol-gel layer preferably comprises by mass, relative to the total mass of the main compounds forming the sol-gel layer:

50% to 100%, preferably 70% to 95% and better still 85% to 90% of silica comprising organic functions of the matrix, and/or 0 to 10%, preferably 1% to 5% and better still 2% to 4% of metal oxide of the matrix, and/or 0 to 40%, preferably 1% to 20%, and better still 5% to 15% of metal oxide and/or chalcogenide particles dispersed in the matrix.

The sol-gel layer is obtained by curing a sol-gel solution and comprises the product resulting from the hydrolysis and from the condensation of at least one organosilane of general formula $R_nSiX_{(4-n)}$ in which:

n is equal to 1, 2, 3, preferably n is equal to 1 or 2 and better still n is equal to 1, the groups X, which may be identical or different, represent hydrolyzable groups selected from alkoxy, acyloxy or halide groups, preferably alkoxy groups, and the groups R, which may be identical or different, represent non-hydrolyzable organic groups (or organic functions) bonded to silicon via a carbon atom.

Preferably, the sol-gel layer is obtained by curing a sol-gel solution and comprises the product resulting from the hydrolysis and from the condensation of:

i) at least one organosilane and
ii) at least one precursor of a metal oxide and/or
iii) particles of at least one metal oxide or of at least one chalcogenide.

The metal oxide particles and/or the precursors of the metal oxides of the organic/inorganic hybrid matrix comprise a metal selected from titanium, zirconium, zinc, niobium, aluminum and molybdenum.

The organosilane(s) comprise two or three, in particular three, hydrolyzable groups X, and one or two, in particular one, non-hydrolyzable group R.

The groups X are preferably selected from alkoxy groups —O—R', in particular C1-C4 alkoxy, acyloxy groups —O—C(O)R' where R' is an alkyl radical, preferably of C1-C6, preferably methyl or ethyl, halide such as Cl, Br and I, and combinations of these groups. Preferably, the groups X are alkoxy groups and in particular methoxy or ethoxy.

The group R is a non-hydrolyzable hydrocarbon-based group. A certain number of groups are suitable according to the invention. The presence and the nature of these groups makes it possible to obtain sol-gel layers having thicknesses that are compatible with the applications of the invention.

Preferably, the group R corresponding to the non-hydrolyzable organic function has a molar mass of at least 50 g/mol, preferably of at least 100 g/mol. This group R is therefore a non-removable group, even following the drying step and may be selected, in particular, from: alkyl groups, preferably linear or branched C1 to C10, such as for example methyl, ethyl, propyl, n-butyl, i-butyl, sec-butyl and tert-butyl groups; alkenyl groups, preferably C2 to C10 alkenyl groups, such as for example vinyl, 1-propenyl, 2-propenyl and butenyl groups; alkynyl groups such as for example acetylenyl and propargyl groups; aryl groups, preferably C6 to C10 aryl groups, such as phenyl and naphthyl groups; alkylaryl groups; arylalkyl groups; (meth)acryl and (meth)acryloxypropyl groups; glycidyl and glycidyloxy groups. A preferred compound for the organosilane compound is, in particular, 3-glycidoxypropyltrimethoxysilane (GLYMO).

The metal oxide and/or chalcogenide particles dispersed in the silica-based organic/inorganic hybrid matrix are preferably metal oxide particles comprising a metal selected from titanium, zirconium, zinc, niobium, aluminum and molybdenum.

The organosilanes (i), the metal oxide precursors (ii) and the metal oxides and chalcogenide (iii) are the main compounds of the sol-gel solution. The sol-gel solution may comprise, in addition to the main compounds, at least one solvent and optionally at least one additive.

Among the suitable solvents, mention may be made of water, methanol, ethanol, propanol (n-propanol and isopropanol), butanol, 1-methoxy-2-propanol, 4-hydroxy-4-methyl-2-pentanone, 2-methyl-2-butanol, butoxyethanol and water/organic solvent mixtures. The proportions of solvent may vary within a broad range. They will depend in particular on the thicknesses to be obtained. Indeed, the greater the solid content of the sol-gel solution, the more possible it is to deposit large thicknesses and therefore to obtain sol-gel layers of large thicknesses.

The additives may be surfactants, UV absorbers, hydrolysis and/or condensation catalysts and curing catalysts.

The sol-gel solution may also comprise, as additives, colorants, which is particularly advantageous in the case where it is the second outer layer that comprises the sol-gel layer, since the latter then forms an absorbent element as described above. In particular it is possible to introduce into the matrix of colloidal particles colored metal oxides such as particles of oxide of cobalt, vanadium, chromium, manganese, iron, nickel, copper, and of any other transition metals and non-metals capable of acting as colorant.

The total proportions of the additives preferably represent less than 5% by mass relative to the total mass of the sol-gel solution.

The sol-gel layer may be deposited according to any suitable known technique, in particular by dip coating; spin coating; laminar-flow-coating or meniscus coating; spray coating; soak coating; roll processing; paint coating; screen printing. Preferably, the sol-gel layer is deposited by spraying with pneumatic atomization. The drying temperature of the sol-gel film may range from 0° C. to 200° C., preferably from 100° C. to 150° C., more preferably from 120° C. to 170° C.

According to one aspect of the invention, the other outer layer of the layered element, that is to say the outer layer located on the other side of the central layer with respect to the textured outer layer, comprises at least one interlayer sheet made of organic polymer material, in particular that is thermoformable or pressure-sensitive, having a refractive index substantially equal to that of the textured outer layer, which is positioned against the textured main surface of the central layer on the opposite side from the textured outer layer and formed against this textured surface by heating and/or compression. It may be, in particular, at least one sheet based on polyvinylbutyral (PVB), ethylene-vinyl acetate (EVA), polyurethane (PU), polyethylene terephthalate (PET), polyvinyl chloride (PVC). This interlayer sheet may be laminated or calendered to a substrate, in particular a glass substrate.

The layered element may be a glazing, It may be a flat or curved glazing.

As a variant, the layered element may be a flexible film. Such a flexible film is advantageously equipped, on one of its outer main surfaces, with an adhesive layer covered with a protective strip that is intended to be removed for the adhesive bonding of the film. The layered element in the form of a flexible film is then capable of being added by adhesive bonding to an existing surface, for example a surface of a glazing, in order to give this surface diffuse reflection properties, while maintaining specular transmission properties and a high level of clarity of vision through the glazing even when the light contrast between the two sides of the glazing is relatively low. The glazing to which the layered element in the form of a flexible film is added may be a flat or curved glazing.

Thus, one subject of the invention is a glazing for a vehicle, a building, street furniture, interior furnishings, lighting device, display support, projection screen, comprising at least one layered element as described above.

Another subject of the invention is the use of a layered element as described above as all or part of a glazing for a vehicle, a building, street furniture, interior furnishings, lighting device, display support, projection screen.

In the case of a vehicle glazing, the invention is particularly advantageous for roof glazings, side window glazings, rear window glazings.

A layered element according to the invention may have various functions when it acts in the visible wavelength range, by diffusing the visible light incident on the side of the first outer layer while allowing clear vision when it is observed from the side the second outer layer, for example a decorative or esthetic function; a privacy function for providing privacy; a display function for communication or advertising purposes, especially using pictures or logos as described above; a function for projecting images, where it is possible to project images on a first side of a glazing or a film comprising the layered element, corresponding to the side of the first outer layer, with the projector and the user both located on this first side, while retaining good vision through the glazing or the film for an observer located on the side opposite to the first side, corresponding to the side of the second outer layer. A layered element according to the invention may also have other functions when it acts in other wavelength ranges, for example a function of diffusing infrared radiation incident on the side of the first outer layer.

The characteristics and advantages of the invention will appear in the following description of several embodiments of a layered element, given solely by way of example and with reference to the appended drawings, in which:

FIG. 8 is a diagram showing steps of a process for manufacturing the layered element of FIG. 7; and FIG. 9 is a cross section similar to FIG. 1 for a layered element in accordance with a fifth embodiment of the invention.

Figure 1:
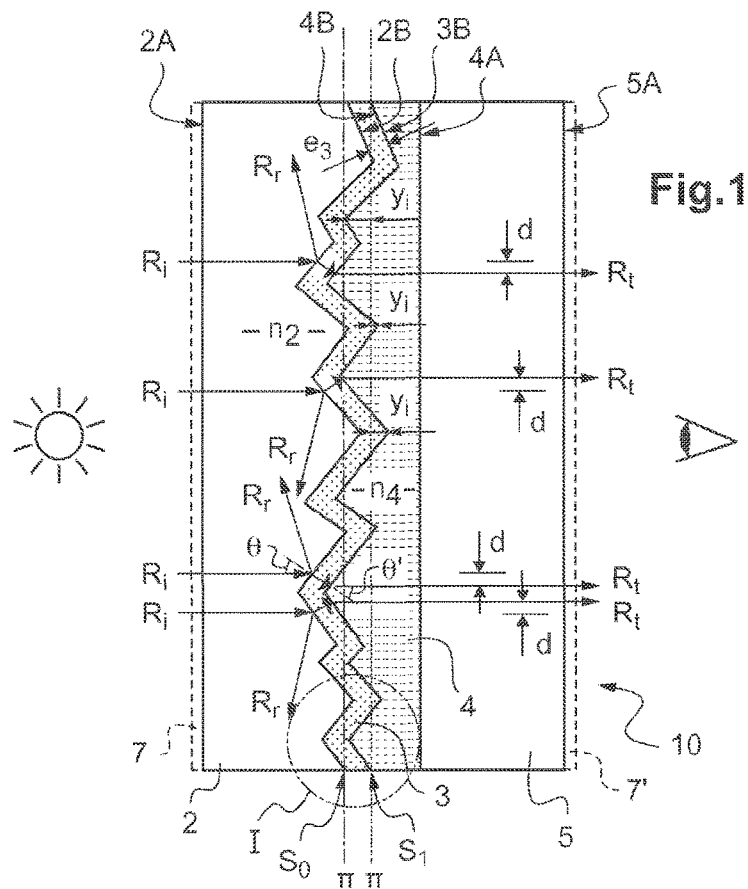
FIG. 1 is a schematic cross section of a layered element in accordance with a first embodiment of the invention.

For the clarity of the drawing, the relative thicknesses of the various layers in FIGS. 1 to 9 have not been rigorously respected. Furthermore, the possible thickness variation of the or each constituent layer of the central layer as a function of the slope of the texture has not been represented in the figures, it being understood that this possible thickness variation has no impact on the parallelism of the textured contact surfaces. Indeed, for each given slope of the texture, the textured contact surfaces are parallel to one another.

In the first embodiment represented in FIG. 1, the layered element 10 comprises two outer layers 2 and 4, which are constituted of transparent dielectric materials having substantially the same refractive index n2, n4. Each outer layer 2 or 4 has a smooth main surface, respectively 2A or 4A, oriented toward the outside of the layered element, and a textured main surface, respectively 2B or 4E, oriented toward the inside of the layered element.

The textures of the inner surfaces 2B and 4B are complementary with one another. As is clearly visible in FIG. 1, the textured surfaces 2B and 4B are positioned opposite one another, in a configuration where their textures are strictly parallel to one another. The layered element 10 also comprises a central layer 3, inserted in contact between the textured surfaces 2B and 4B.

Figure 2:
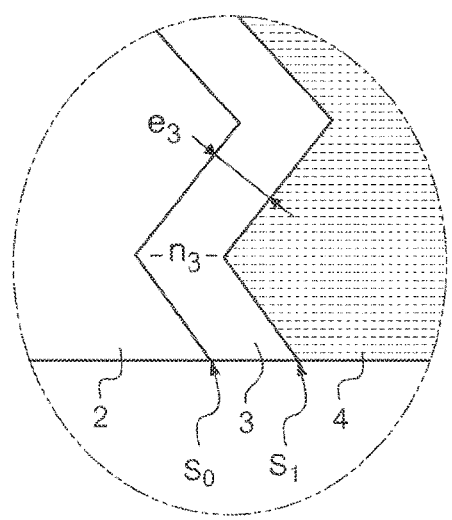
FIG. 2 is a larger scale view of the detail of FIG. 1 for a first variant of the layered element.

In the variant shown in FIG. 2, the central layer 3 is a single layer and is constituted of a transparent material which is either metallic, or dielectric having a refractive index n3 different from that of the outer layers 2 and 4.

Figure 3:
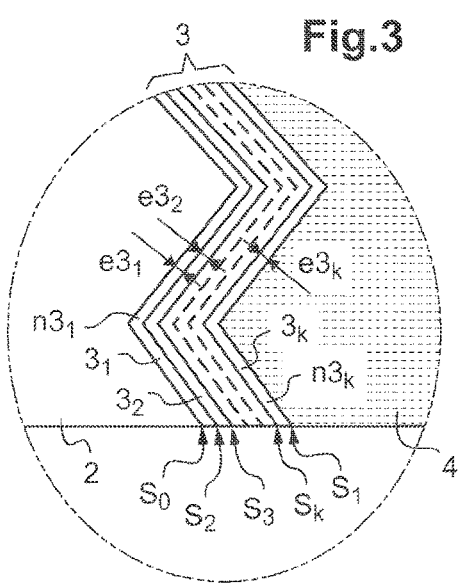
FIG. 3 is a larger scale view of the detail of FIG. 1 for a second variant of the layered element.

In the variant shown in FIG. 3, the central layer 3 is formed by a transparent stack of several layers $3_1, 3_2, \ldots, 3_k$, where at least one of the layers $3_1$ to $3_k$ is either a layer made of metallic material, or a layer made of dielectric material having a refractive index different from that of the outer layers 2 and 4.

In FIGS. 1 to 3, $S_0$ denotes the contact surface between the outer layer 2 and the central layer 3, and $S_1$ denotes the contact surface between the central layer 3 and the outer layer 4. Furthermore, in FIG. 3, the inner contact surfaces of the central layer 3 are successively denoted by $S_2$ to $S_k$, starting from the contact surface closest to the surface $S_0$.

In the variant of FIG. 2, due to the arrangement of the central layer 3 in contact between the textured surfaces 2B and 4B which are parallel to one another, the contact surface $S_0$ between the outer layer 2 and the central layer 3 is textured and parallel to the contact surface $S_1$ between the central layer 3 and the outer layer 4. In other words, the central layer 3 is a textured layer having a uniform thickness e3, taken perpendicular to the contact surfaces $S_0$ and $S_1$.

In the variant of FIG. 3, each contact surface $S_2, \ldots, S_k$ between two adjacent layers of the constituent stack of the central layer 3 is textured and strictly parallel to the contact surfaces $S_0$ and $S_1$ between the outer layers 2, 4 and the central layer 3. Thus, all the contact surfaces $S_0, S_1, \ldots, S_k$ between adjacent layers of the element 10 which are either of different natures, dielectric or metallic, or are made of dielectric materials having different refractive indices, are textured and parallel to one another. In particular, each layer $3_1, 3_2, \ldots, 3_k$ of the constituent stack of the central layer 3 has a uniform thickness $e3_1, e3_2, \ldots, e3_k$, taken perpendicular to the contact surfaces $S_0, S_1, \ldots, S_k$.

As shown in FIG. 1, the texture of each contact surface $S_0$, $S_1$ or $S_0, S_1, \ldots, S_k$ of the layered element 10 is formed by a plurality of features that are recessed or protruding relative to a general plane it of the contact surface. The mean height of the features of each textured contact surface $S_0, S_1$ or $S_0, S_1, \ldots, S_k$ is between 1 μm and 2 mm, preferably between 2 μm and 200 μm. The mean height of the features of each textured contact surface is defined as the arithmetic mean $$\frac{1}{n}\sum_{i=1}^{n} |y_i|,$$

with $y_i$ the distance taken between the peak and the plane π for each feature of the surface, as shown schematically in FIG. 1.

According to one aspect of the invention, the thickness e3 or $e3_1, e3_2, \ldots, e3_k$ of the or each constituent layer of the central layer 3 is less than the mean height of the features of each textured contact surface $S_0, S_1$ or $S_0, S_1, \ldots, S_k$ of the layered element 10. This condition is important for increasing the probability that the inlet interface of radiation into a layer of the central layer 3 and the outlet interface of radiation out of this layer are parallel, and for thus increasing the percentage of specular transmission of the radiation through the layered element 10. For the sake of visibility of the various layers, this condition has not been strictly respected in FIGS. 1 to 9. In practice, when the central layer 3 is a thin layer or a stack of thin layers, the thickness e3 or $e3_1, e3_2, \ldots, e3_k$ of each layer of the central layer 3 is of the order of, or less than, 1/10 of the mean height of the features of each textured contact surface of the layered element.

FIG. 1 illustrates the path of radiation, which is incident on the layered element 10 on the side of a first outer layer 2. The incident rays $R_i$ arrive on the first outer layer 2 at a given angle of incidence θ. A portion of the incident radiation is reflected in a specular manner on the outer surface 2A of the first outer layer 2, owing to the difference in refractive index between the air and the constituent material of the outer layer 2. In order to reduce this reflection, an antireflection coating 7 is advantageously provided on the surface 2A of the first outer layer 2. As mentioned above, the antireflection coating 7 may be of any type that makes it possible to reduce the reflection of radiation at the interface between the air and the first outer layer 2. It may be in particular a layer having a refractive index between the refractive index of air and the refractive index of the first outer layer 2, a stack of thin layers acting as an interference filter, or else a stack of thin layers having a gradient of refractive indices.

As shown in FIG. 1, the incident rays $R_i$, when they reach a contact surface $S_i$ between two adjacent layers of different natures, dielectric or metallic, or having different refractive indices, are reflected either by the metal surface, or owing to the difference in refractive index at this contact surface. As the contact surface $S_i$ is textured, the reflection takes place in a plurality of directions $R_r$. The reflection of the radiation by the layered element 10 is therefore diffuse.

A portion of the incident radiation is also refracted in the central layer 3. In the variant of FIG. 2, the contact surfaces $S_0$ and $S_1$ are parallel to one another, which implies, according to the Snell-Descartes law, that n2. sin (θ)=n4. sin (θ') where θ is the angle of incidence of the radiation on the central layer 3 starting from the first outer layer 2 and θ' is the angle of refraction of the radiation in the second outer layer 4 starting from the central layer 3. In the variant of FIG. 3, as the contact surfaces $S_0$, $S_1$, $S_k$ are all parallel to one another, the relationship n2. sin (θ)=n4. sin (θ') derived from the Snell-Descartes law remains proven. Hence, in the two variants, as the refractive indices n2 and n4 of the two outer layers are substantially equal to one another, the rays $R_t$ transmitted by the layered element are transmitted with an angle of transmission θ' equal to their angle of incidence θ on the layered element. The transmission of the radiation by the layered element 10 is therefore specular.

Owing to the refraction in the central layer 3, the transmitted rays $R_t$ are parallel to the incident rays $R_i$ while being slightly deflected with respect thereto, as shown by the offset d in FIG. 1. In practice, given the small thickness of the central layer 3, the offset d is small enough, in particular of the order of several nanometers, not to impact the clarity of vision through the layered element 10.

It should be noted that, for the same reasons as above, radiation incident on the layered element 10 on the side of the second outer layer 4 also tends to be reflected in a diffuse manner and transmitted in a specular manner by the layered element. The idea of the invention is then to give the layered element 10 asymmetry, so as to reduce the impression of haze or "dirty glazing" for an observer located on the side of the second outer layer 4, and thus to guarantee clear vision through the element 10, even when the light contrast between the two sides of the element 10 is low or zero, or even when the luminosity on the side of the second outer layer 4 is greater than that on the side of the first outer layer 2.

For this purpose, according to a first approach, it is ensured that the layered element 10 comprises clear materials on the side of the first outer layer 2 relative to the central layer 3, in particular having a light transmission $T_L$ of greater than or equal to 80%, and at least one absorbent element on the side of the second outer layer 4 relative to the central layer 3, having a light transmission $T_L$ of between 10% and 60%.

By way of example, in the embodiment of FIG. 1, the first outer layer 2 is a textured substrate made of clear or extra-clear glass, for example a textured glass of SGG SATINOVO® or SGG ALBARINO® type sold by Saint-Gobain Glass, and the second outer layer 4 is formed by an interlayer sheet, for example made of PVB, which has substantially the same refractive index as the substrate 2 and which conforms to the texture of the textured surface 3B of the central layer 3. The interlayer sheet 4 is calendered via its outer surface 4A to a flat substrate 5 made of tinted glass, for example a bulk-tinted glass of SGS THERMOCONTROL® Venus Grey 10 type sold by Saint-Gobain Sekurit. Thus, in this example, the absorbent element incorporated into the layered element 10 on the side of the second outer layer 4 is the substrate 5. According to one variant, the interlayer sheet 4 may also act as an absorbent element, for example by selecting a bulk-tinted PVB sheet, which may then be calendered either to a flat substrate 5 made of clear or extra-clear glass, for example a glass of SGG PLANILUX® type sold by Saint-Gobain Glass, or to a flat substrate 5 made of tinted glass as above.

According to a second approach, asymmetry is conferred upon the layered element 10 by selecting, as the central layer 3, an asymmetric stack of thin layers $3_1, 3_2, \ldots, 3_k$ such that the ratio of the total reflection $R_e$ of the central layer 3 on the side turned toward the first outer layer 2 in a given wavelength range, for example the visible wavelength range, to the total reflection $R_1$ of the central layer 3 on the side turned toward the second outer layer 4 in said given wavelength range is greater than or equal to 1.5, preferably greater than or equal to 2. Advantageously, this stack of layers may be additionally adapted to give solar control and/or low emissivity properties to the layered element 10.

The first and second approaches that aim to render the layered element 10 asymmetric may of course be combined, that is to say that the layered element may comprise both a central layer 3 formed by an asymmetric stack of thin layers and at least one absorbent element positioned on the side of the second outer layer 4 with respect to the central layer 3.

Irrespective of the approach selected for rendering the layered element 10 asymmetric, an antireflection coating 7' is preferably provided on the outer main surface of the layered element 10 located on the side of the second outer layer 4, namely the surface 5A in FIG. 1, so as to reduce the reflection due to the difference in refractive index between the air and the constituent material of the substrate 5. The presence of the antireflection coating 7' is particularly important for limiting the specular reflection of radiation on the surface 5A and avoiding any degradation of the clarity of vision through the element 10 for an observer placed on the side of the second outer layer 4. In the same way as the antireflection coating 7, the antireflection coating 7' may be of any type that makes it possible to reduce the reflection of radiation at the interface between the air and the substrate 5. It may be in particular a layer having a refractive index between the refractive index of air and the refractive index of the substrate 5, a stack of thin layers acting as an interference filter, or else a stack of thin layers having a refractive index gradient.

Figure 4:
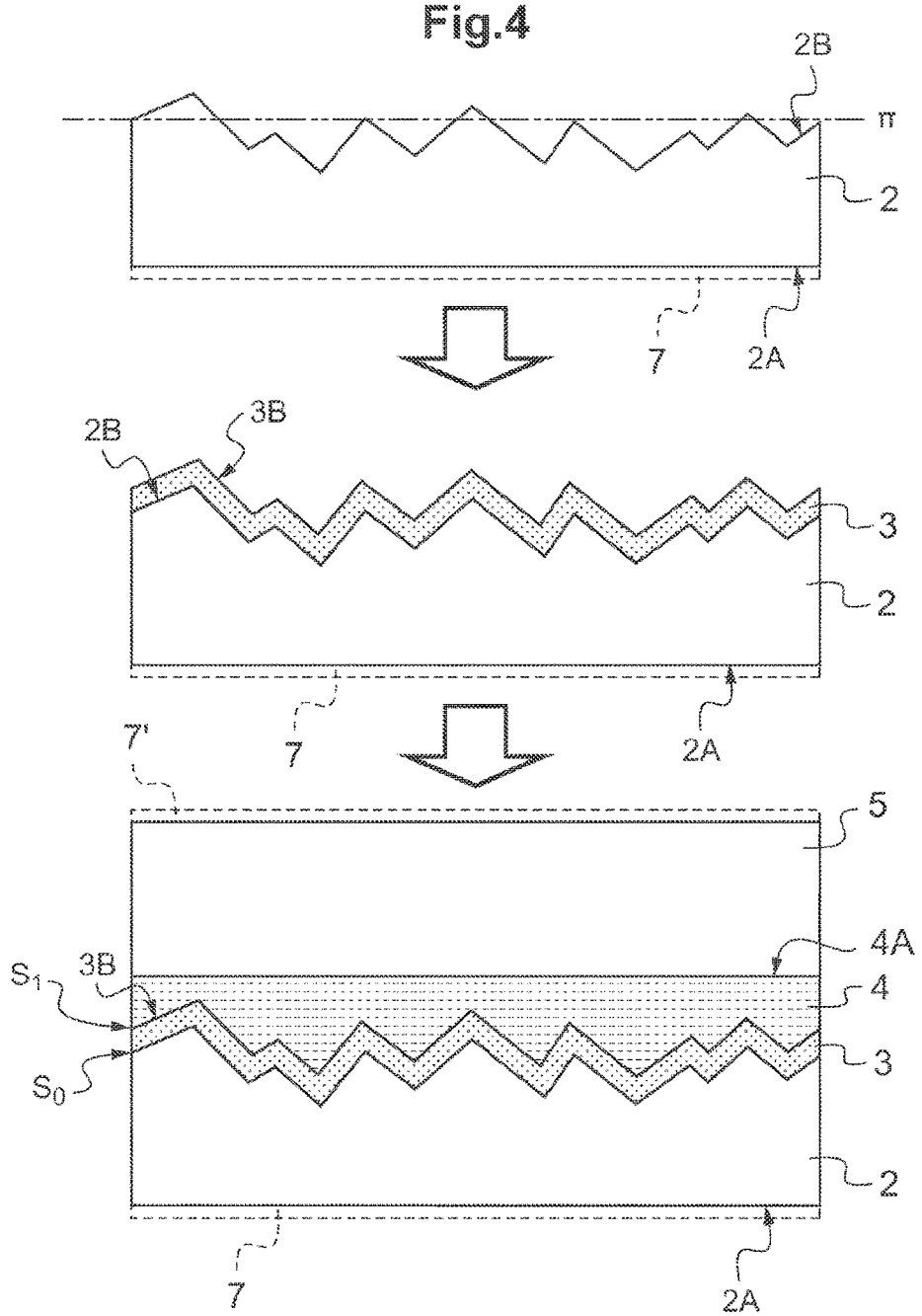
FIG. 4 is a diagram showing steps of a process for manufacturing the layered element of FIG. 1.

An example of a process for manufacturing the layered element 10 is described below, with reference to FIG. 4.

According to this process, the central layer 3 is deposited in a conformal manner on the textured surface 23 of the substrate 2 forming the first outer layer. The main surface 2A of this substrate on the opposite side from the textured surface 23 is smooth and provided with the antireflection coating 7. The conformal deposition of the central layer 3, whether it is a single layer or formed by a stack of several layers, is preferably carried out, under vacuum, by magnetron sputtering. This technique makes it possible to deposit, on the textured surface 23 of the substrate 2, either the single layer in a conformal manner, or the various layers of the stack successively in a conformal manner. These may in particular be thin dielectric layers, in particular layers of $Si_3N_4$, $SnO_2$, ZnO, $SnZnO_x$, AlN, NbO, NbN, $TiO_2$, $SiO_2$, $Al_2O_3$, $MgF_2$, $AlF_3$, or thin metallic layers, in particular layers of silver, gold, titanium, niobium, silicon, aluminum, nickel-chromium (NiCr) alloy, or alloys of these metals.

The central layer 3 may be, by way of example:
a layer of $TiO_2$ having a thickness between 55 and 65 nm, and a refractive index of 2.45 at 550 nm, or
a stack of layers comprising at least one silver-based layer as described in patent applications WO 02/48065 A1 or EP 0 847 965 A1.

Following the deposition of the central layer 3, the interlayer sheet 4 and the substrate 5 are positioned successively on the opposite side from the substrate 2 and starting from the textured main surface 33 of the central layer 3, and compression and/or heating, at least at the glass transition temperature of the interlayer sheet 4, are applied to the laminated structure thus formed, for example in a press or an oven. During this laminating process, the interlayer sheet 4 conforms to the texture of the textured surface 33 of the central layer 3, which guarantees that the contact surface $S_1$ between the central layer 3 and the outer layer 4 is well textured and parallel to the contact surface $S_0$ between the central layer 3 and the outer layer 2.

Figure 5:
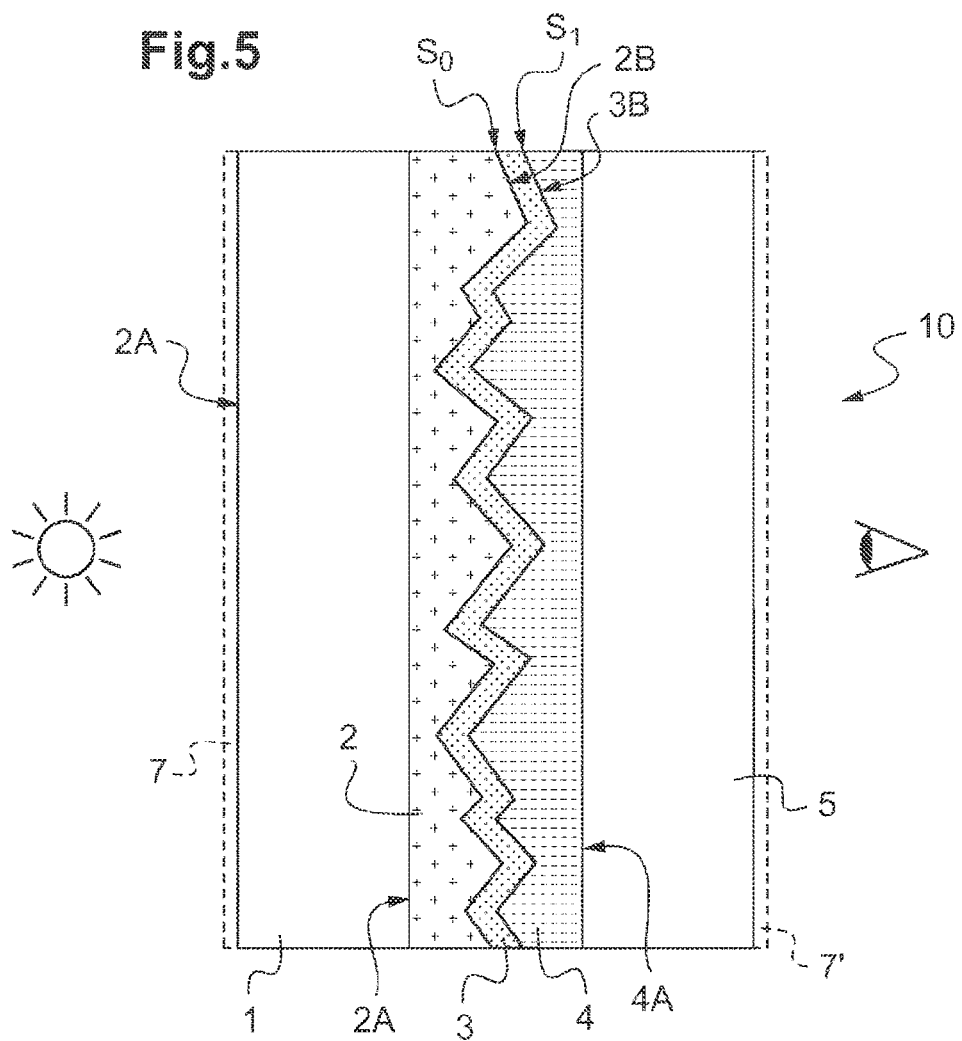
FIG. 5 is a cross section similar to FIG. 1 for a layered element in accordance with a second embodiment of the invention.

In the second embodiment represented in FIG. 5, the elements analogous to those of the first embodiment bear identical references. This second embodiment differs from the first embodiment only in that the first outer layer 2 is not a textured glass, but a film of polyethylene terephthalate (PET), one main surface 2B of which is textured, it being possible in particular for this texturing to be obtained by embossing. Thus, in the layered element 10 of the second embodiment, the first outer layer 2 is a textured flexible substrate, which is firmly attached via its smooth outer surface 2A to a flat substrate 1 made of clear or extra-clear glass, for example glass of SGG PLANILUX® type sold by Saint-Gobain Glass. In this embodiment, the central layer 3 is deposited in a conformal manner onto the textured surface 2B of the film 2.

Figure 6:
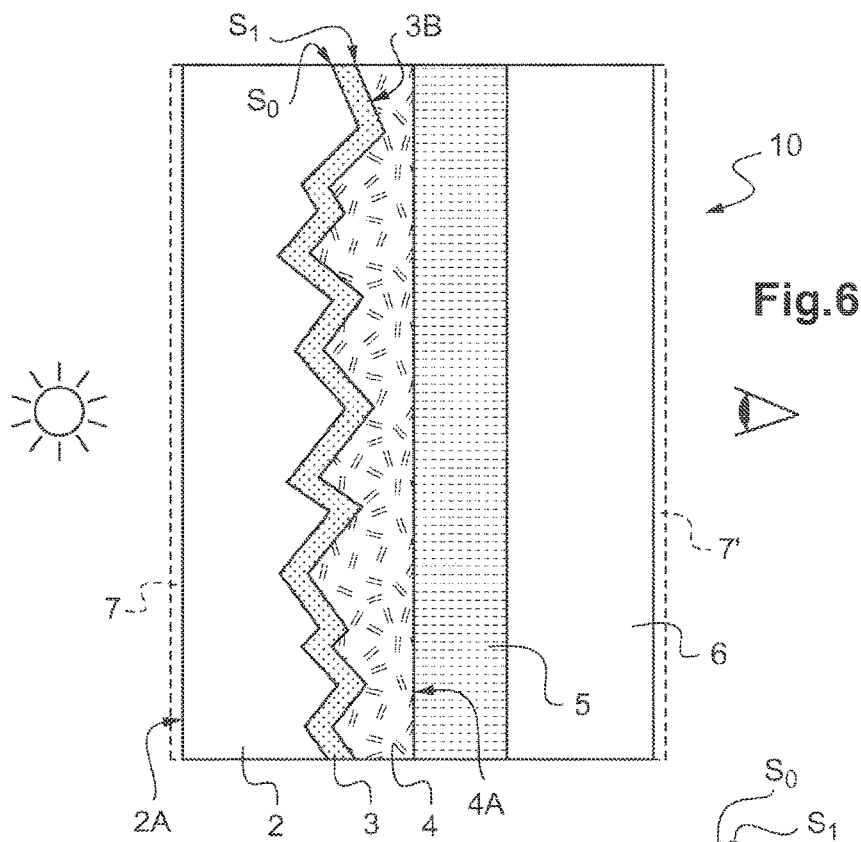
FIG. 6 is a cross section similar to FIG. 1 for a layered element in accordance with a third embodiment of the invention.

In the third embodiment represented in FIG. 6, the elements analogous to those of the first embodiment bear identical references. This third embodiment differs from the first embodiment only in that the second outer layer 4 is not an interlayer sheet, but a transparent sol-gel layer comprising a silica-based organic/inorganic hybrid matrix, having a refractive index substantially equal to that of the substrate 2. This sol-gel layer 4 is deposited by a sol-gel process onto the textured surface 3B of the central layer 3 and comes, in the viscous, liquid or pasty state, to adopt the texture of the surface 3B. Thus, it is guaranteed that, in the cured state of the layer 4, the contact surface $S_1$ between the central layer 3 and the outer layer 4 is well textured and parallel to the contact surface $S_0$ between the central layer 3 and the outer layer 2.

Furthermore, the layered element 10 of the third embodiment successively comprises, as additional layers, positioned on the side of the second outer layer 4, an interlayer sheet 5, for example made of PVB, which is calendered via its outer surface to a flat substrate 6 made of tinted glass, for example a bulk-tinted glass of SGS THERMOCONTROL® Venus Grey 10 type sold by Saint-Gobain Sekurit. Thus, in this example, the absorbent element integrated into the layered element 10 on the side of the second outer layer 4 is the substrate 6. According to one variant, the sol-gel layer 4 and/or the interlayer sheet 5 may also act as absorbent elements, for example by selecting a sol-gel layer comprising colorants as additives or a bulk-tinted PVB sheet. In this variant, the interlayer sheet 5 may be calendered either to a flat substrate 6 made of clear or extra-clear glass, for example a glass of SGG PLANILUX® type sold by Saint-Gobain Glass, or to a flat substrate 6 made of tinted glass as above.

Figure 7:
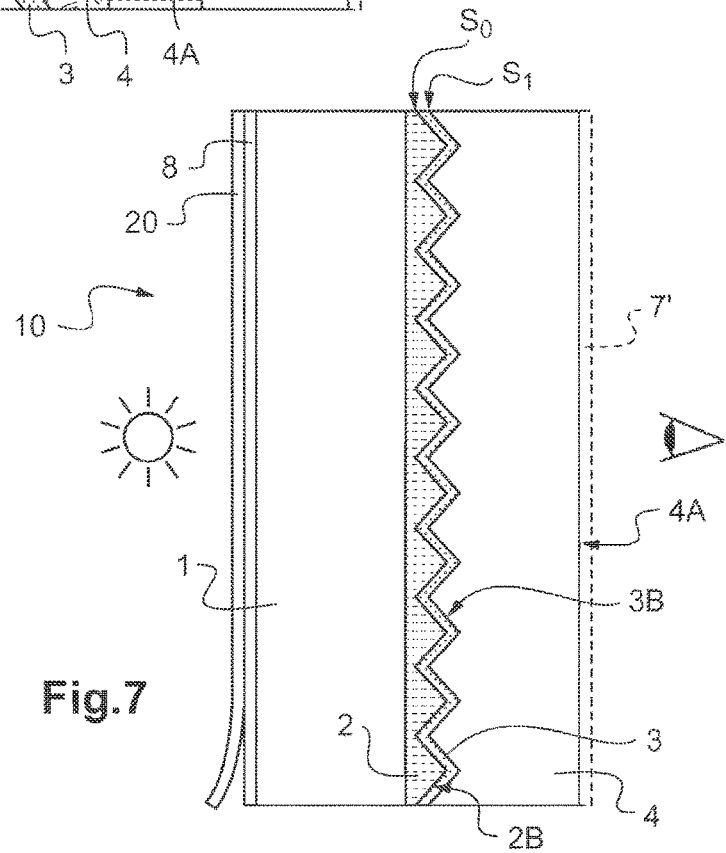
FIG. 7 is a cross section similar to FIG. 1 for a layered element in accordance with a fourth embodiment of the invention.

In the fourth embodiment represented in FIG. 7, the elements analogous to those of the first embodiment bear identical references. In this fourth embodiment, the layered element 10 is a flexible film having a total thickness of the order of 50-300 μm. The first outer layer 2 of this layered element is a layer made of a material that is photocrosslinkable and/or photopolymerizable under the action of UV radiation, which is textured on one of its main faces 2B. The layer 2 is applied via its non-textured main surface against one of the main surfaces of a flexible film 1 made of polymer material, the two main surfaces of which are smooth. By way of example, the film 1 is a film of polyethylene terephthalate (PET) having a thickness of 100 μm, which preferably has increased UV resistance, and the layer 2 is a layer of UV-curable resin of KZ6661 type sold by JSR Corporation having a thickness of around 10 μm. In the cured state, the resin layer 2 has good adhesion with the PET.

The resin layer 2 is applied to the film 1 with a viscosity enabling texturing to be instated on its surface 2B on the opposite side to the film 1. The texturing of the surface 2B may be carried out by any appropriate technique, in particular by embossing. In the example of FIG. 8, the texturing of the surface 2B is carried out using a roll 9 having on its surface a texturing complementary to that to be formed on the layer 2. Once the texturing is formed and/or during its formation, the superposed film 1 and resin layer 2 are irradiated with UV radiation, as shown by the arrow of FIG. 8, which enables the solidification of the resin layer 2 with its texturing and the assembling of the film 1 and the resin layer 2.

A central layer 3, which may be a single layer or formed by a stack of layers as described above and which comprises at least one layer made of metallic material or made of dielectric material having a refractive index different from that of the first outer layer 2, is then deposited in a conformal manner on the textured surface 2B, in particular by magnetron sputtering.

A second PET film having a thickness of 100 μm, this time bulk-tinted so as to form an absorbent element, is then deposited on the central layer 3 and forms the second outer layer 4 of the layered element 10. The flexible film 4 and the layer 2 both have substantially the same refractive index, of the order of 1.65 at 550 nm. The flexible film 4 is conformed to the textured surface 3B of the central layer 3 on the opposite side from the first outer layer 2 by compression and/or heating at the glass transition temperature of the PET.

An adhesive layer 8 of PSA (pressure sensitive adhesive) type, covered with a protective strip (liner) 20 intended to be removed for the adhesive bonding, may be added to one or other of the outer surfaces of the layered element 10, preferably to the outer surface located on the side of the first outer layer 2, that is to say the outer surface of the film 1 as shown in FIG. 7. The layered element 10 is thus in the form of a flexible film ready to be added, by adhesive bonding, to a surface, such as a surface of a glazing, in order to give this surface diffuse reflection properties. In the example of FIG. 7, the outer surface of the film 4 is provided with an antireflection coating 7'.

Particularly advantageously, as suggested in FIG. 8, the various steps of the process may be carried out continuously on one and the same production line.

In the fifth embodiment represented in FIG. 9, the elements analogous to those of the first embodiment bear identical references. As in the fourth embodiment, the layered element 10 of this fifth embodiment is a flexible film having a total thickness of the order of 50-300 μm, the first outer layer 2 of which is a layer made of material that is photocrosslinkable and/or photopolymerizable under the action of UV radiation, which is textured on one of its main faces 2B and applied via its non-textured main surface against a main surface of a flexible film 1 made of polymer material having its two main surfaces smooth. The texturing of the surface 2B of the layer 2 may be carried out by any appropriate technique, in particular by embossing.

This fifth embodiment differs from the fourth embodiment in that the second outer layer 4 is not a film made of polymer material, but an adhesive layer selected in order to have a refractive index match with the layer 2 made of photocrosslinkable and/or photopolymerizable material. The adhesive layer 4 provides the bond between the central layer 3 and a second film 5 made of polymer material, which is bulk-tinted so as to form an absorbent element. A protective layer 6, anti-scratch layer or "hardcoat layer" type, is advantageously applied to the outer main surface of the film 5, on the opposite side from the adhesive layer 4. It is noted that the refractive index match which matters in this embodiment is that between the layer 2 made of photocrosslinkable and/or photopolymerizable material and the adhesive layer 4. This fifth embodiment thus makes it possible to have a greater choice of materials for the layer 2, since it is no longer necessary for the layer 2 to have substantially the same refractive index as the film 5.

By way of example, in the layered element 10 of this fifth embodiment: the film 1 is a PET film having a thickness of 25 μm, which preferably has increased UV resistance; the layer 2 is an acrylate-based resin layer that is photocrosslinkable under the action of UV radiation having a thickness of between 1 μm and 10 μm and a refractive index of the order of 1.52 at 550 nm; the central layer 3 is a single layer or a stack of layers comprising at least one layer made of metallic material or made of dielectric material having a refractive index different from that of the layer 2, deposited in a conformal manner on the textured surface 2B, in particular by magnetron sputtering; the layer 4 is a layer of adhesive of PSA (pressure sensitive adhesive) type having a thickness of between 1 μm and 10 μm and a refractive index of the order of 1.52 at 550 nm; the film 5 is a bulk-tinted PET film having a thickness of between 25 μm and 50 μm.

As in the fourth embodiment, a layer of adhesive 8 of PSA (pressure sensitive adhesive) type, covered with a protective strip (liner) 20 intended to be removed the adhesive bonding, is added to the outer surface of the film 1. The layered element 10 is thus in the form of a flexible film ready to be added by adhesive bonding to a surface, such as a surface of a glazing, in order to give this surface diffuse reflection properties. An antireflection coating 7' may also be provided on the outer surface of the layered element 10 on the opposite side from the adhesive layer 8.

It should be noted that, in each of the embodiments described above, the antireflection coating 7 or 7' may be put in place, on the corresponding outer surface of the layered element, either before or after assembling the layered element.

The invention is not limited to the examples described and represented. In particular, when the layered element is a flexible film as in the examples FIGS. 7 to 9, the thickness of each layer formed based on a polymer film, for example based on a PET film, may be different from those described above, in particular of the order of 10 μm to 1 mm.

Furthermore, the texturing of the first outer layer 2 in the examples of FIGS. 7 to 9 may be obtained without resorting to a layer of curable resin deposited on a polymer film, but directly by hot embossing a polymer film, in particular by rolling using a textured roll or by pressing using a punch.

Constructions similar to the embodiments of FIGS. 1 to 6 may also be envisaged with plastic substrates instead of glass substrates.

The layered element according to the invention is capable of being used for all known applications of glazings, such as for vehicles, buildings, street furniture, interior furnishings, lighting devices, display supports, projection screens, etc., where it is desired to obtain properties of specular transmission and of diffuse reflection of a radiation incident on the glazing on the side of a first outer layer of the layered element, while having a high level of clarity of vision through the glazing for an observer placed on the side of the second outer layer of the layered element, even when the light contrast between the two sides of the glazing is relatively low or zero, or even when the luminosity on the side of the second outer layer is greater than that on the side of the first outer layer.

EXAMPLES

The optical properties of four examples of layered elements are given in Table 1 below.

In the example no. 1, the first outer layer 2 is formed by a SGS THERMOCONTROL® Venus Green 35 tinted glass having a thickness of 2 mm, on a main surface of which a texture has been formed by sandblasting.

In each example, the central layer 3 is a stack of layers deposited by magnetron deposition in a conformal manner on the textured surface of the textured substrate forming the first outer layer 2.

In examples no. 1 and no. 2, the central layer 3 is a solar-control stack comprising two thin silver-based layers, referred to as "SKN 144", corresponding to the product referenced SGG COOL-LITE® SKN 144 II from Saint-Gobain Glass.

The optical properties of the layered elements given in Table 1 are the following:

$R_{effective}$: the total light reflection in the visible spectrum, in %, of the layered element radiation at normal incidence on the layered element on the side of the first outer layer 2, measured according to the ISO 9050:2003 standard (D65 illuminant; 2° observer);

$R_{stray}$: the total light reflection in the visible spectrum, in %, of the layered element for radiation at normal incidence on the layered element on the side of the second outer layer 4, measured according to the ISO 9050:2003 standard (D65 illuminant; 2° observer);

$T_{effective}$: the light transmission in the visible spectrum, in %, of the layered element, measured according to the ISO 9050:2003 standard (D65 illuminant; 2° observer), where the measurement is carried out with the radiation at normal incidence that passes through the layered element by going from the first outer layer 2 toward the second outer layer 4;

$R_e$: the total light reflection in the visible spectrum, in %, of the central layer 3 on the side of the first outer layer 2, measured according to the ISO 9050:2003 standard (D65 illuminant; 2° observer), where the measurement is carried out with the central layer 3 deposited on a flat glass of SGG PLANILUX® type having a thickness of 4 mm and with the radiation at normal incidence on the central layer 3 on the side which is adjacent to the first outer layer 2 in the layered element;

$R_i$: the total light reflection in the visible spectrum, in %, of the central layer 3 on the side of the second outer layer 4, measured according to the ISO 9050:2003 standard (D65 illuminant; 2° observer), where the measurement is carried out with the central layer 3 deposited on a flat glass of SGG PLANILUX® type having a thickness of 4 mm and with the radiation at normal incidence on the central layer 3 on the side which is adjacent to the second outer layer 4 in the layered element;

T: the light transmission in the visible spectrum, in %, of the central layer 3, measured according to the ISO 9050:2003 standard (D65 illuminant; 2° observer), where the measurement is carried out with the central layer 3 deposited on a flat glass of SGG PLANILUX® type having a thickness of 4 mm and with the radiation at normal incidence that passes through the central layer 3 by going from the side which is adjacent to the first outer layer 2 in the layered element toward the side which is adjacent to the second outer layer 4 in the layered element.

two outer layers, which each have a smooth outer main surface and which are constituted of dielectric materials having substantially the same refractive index; and
a central layer inserted between the outer layers, the central layer being formed either by a single layer made of metallic material or made of dielectric material

TABLE 1

| Example | No. 1 (comparative) | No. 2 | No. 3 (comparative) | No. 4 |
|---|---|---|---|---|
| First outer layer 2 | SGS THERMOCONTROL ® Venus Green 35 2 mm textured | SGG SATINOVO ® 4 mm | SGG SATINOVO ® 4 mm | SGG STAINOVO ® 4 mm |
| Central layer 3 (starting from the first outer layer 2) | SKN 144 | SKN 144 | SiN 20 nm<br>NiCr 1.5 nm<br>Ag 18 nm<br>NiCr 1.5 nm<br>SiN 20 nm<br>$R_e = R_i = 32\%$<br>T = 30% | $Si_3N_4$ 50 nm<br>NiCr 1.5 nm<br>Ag 10 nm<br>NiCr 1.5 nm<br>NbN 15 nm<br>$Si_3N_4$ 50 nm<br>$R_e = 27\%$<br>$R_i = 11\%$<br>T = 30% |
| Second outer layer 4 | PVB 0.38 mm | PVB 0.38 mm | PVB 0.38 mm | PVB 0.38 mm |
| Additional layer 5 on the side of the second outer layer 4 | SGS THERMOCONTROL ® Venus Green. 35 2 mm | THERMOCONTROL ® Venus Grey 10 2 mm | SGG PLANILUX ® 4 mm | SGG PLANILUX ® 4 mm |
| Properties of the layered element | | | | |
| $R_{effective}$ (%) | 6% | 18.5% | 33% | 28.5% |
| $R_{stray}$ (%) | 6% | 4.5% | 33% | 14% |
| $T_{effective}$ (%) | 13% | 13% | 25.5% | 25.5% |

A comparison of the properties of examples no. 1 and no. 2 shows that, by incorporating into example no. 2 a clear element on the side of the first outer layer 2, namely a SGG SATINOVO® clear glass having a thickness of 4 mm, and an absorbent element on the side of the second outer layer 4, namely a SGS THERMOCONTROL® Venus Grey 10 tinted glass having a thickness of 2 mm, the $R_{effective}/R_{stray}$ and $T_{effective}/R_{stray}$ ratios are increased, while keeping the same value of $T_{effective}$, with respect to example no. 1 where the layered element comprises identical substrates on either side of the central layer 3. The result of this is, for an observer placed on the side of the second outer layer 4, a reduction in the impression of haze or "dirty glazing", and therefore clearer vision through the layered element of example no. 2 in accordance with the invention, relative to the layered element of comparative example no. 1.

Similarly, a comparison of the properties of examples no. 3 and no. 4 shows that, by making the central layer 3 asymmetric in example no. 4 so that $R_e/R_i$ is greater than or equal to 1.5, the $R_{effective}/R_{stray}$ and $T_{effective}/R_{stray}$ ratios are increased, while keeping the same value of $T_{effective}$ and a high value of $R_{effective}$, relative to example no. 3 where the layered element comprises a symmetrical central layer 3. Here too, the result of this is, for an observer placed on the side of the second outer layer 4, a reduction in the impression of haze or "dirty glazing", and therefore clearer vision through the layered element of example no. 4 in accordance with the invention, relative to the layered element of comparative example no. 3.

The invention claimed is:

1. A transparent layered element having two smooth outer main surfaces and comprising:

having a refractive index different from that of the outer layers, or by a stack of layers which comprises at least one layer made of metallic material or made of dielectric material having a refractive index different from that of the outer layers, wherein all contact surfaces between two adjacent layers of the layered element which are one made of metallic material and the other made of dielectric material, or which are two layers made of dielectric materials having different refractive indices, are textured and parallel to one another, wherein a ratio of a total reflection of the layered element on a side of a first outer layer of the two outer layers in a given wavelength range to a total reflection of the layered element on a side of a second outer layer of the two outer layers in said given wavelength range is greater than or equal to 1.5.

2. The layered element as claimed in claim 1, wherein an absorption of the layered element in said given wavelength range for a radiation incident on the side of the second outer layer is strictly greater than the absorption of the layered element in said given wavelength range for a radiation incident on the side of the first outer layer.

3. The layered element as claimed in claim 1, wherein a ratio of the transmission of the layered element in said given wavelength range to the total reflection of the layered element on the side of the second outer layer in said given wavelength range is greater than or equal to 1.5.

4. The layered element as claimed in claim 1, further comprising, either as the second outer layer, or as an additional layer positioned on the side of the second outer layer, at least one absorbent element that absorbs in a visible wavelength range.

5. The layered element as claimed in claim 4, wherein the absorbent element has a light transmission of between 10% and 60%.

6. The layered element as claimed in claim 4, wherein the absorbent element is a rigid or flexible substrate, which is bulk-tinted.

7. The layered element as claimed in claim 4, wherein the absorbent element is a polymer interlayer sheet which is bulk-tinted.

8. The layered element as claimed in claim 4, wherein the absorbent element is an absorbent thin layer positioned on one face of a rigid or flexible substrate, or on one face of a polymer interlayer sheet.

9. The layered element as claimed in claim 1, wherein the central layer is a stack of thin layers comprising an alternation of "n" metallic functional layers and of "(n+1)" antireflection coatings, with n≥1, where each metallic functional layer is positioned between two antireflection coatings.

10. The layered element as claimed in claim 1, wherein the central layer is an asymmetric stack of thin layers, the ratio of a total reflection of the central layer on a side turned toward the first outer layer in said given wavelength range to a total light reflection of the central layer on a side turned toward the second outer layer in said given wavelength range being greater than or equal to 1.5.

11. The layered element as claimed in claim 1, wherein an absolute value of a difference in refractive index at 550 nm between the outer layers and at least one layer made of dielectric material of the central layer is greater than or equal to 0.30.

12. The layered element as claimed in claim 1, wherein an absolute value of a difference in refractive index at 550 nm between the dielectric materials of the two outer layers is less than or equal to 0.150.

13. The layered element as claimed in claim 1, wherein one of the two outer layers comprises a rigid or flexible substrate, one main surface of which is textured.

14. The layered element as claimed in claim 1, wherein one of the two outer layers comprises a conformable layer of which one main surface is textured and which is added via its other main surface to a rigid or flexible substrate.

15. The layered element as claimed in claim 13, wherein one of the two outer layers, which is not the one of the two outer layers comprising the rigid or flexible substrate, comprises a sol-gel layer of matching refractive index comprising a silica-based organic/inorganic hybrid matrix.

16. The layered element as claimed in claim 1, wherein the single layer or each layer of the central layer is a layer deposited by sputtering onto a textured surface.

17. The layered element as claimed in claim 1, further comprising, on the outer main surface located on the side of the second outer layer, an antireflection coating at an interface between air and the material of the layer forming the outer main surface.

18. The layered element as claimed in claim 1, wherein the outer main surfaces of the layered element are curved.

19. A glazing for a vehicle, a building, street furniture, interior furnishings, lighting device, display support, projection screen, comprising:
at least one layered element as claimed in claim 1.

20. The layered element as claimed in claim 1, wherein the ratio of the total reflection of the layered element on the side of the first outer layer in the given wavelength range to the total reflection of the layered element on the side of the second outer layer in said given wavelength range is greater than or equal to 2.

* * * * *